United States Patent [19]
Yach et al.

[11] Patent Number: 5,587,866
[45] Date of Patent: Dec. 24, 1996

[54] POWER-ON RESET CIRCUIT

[75] Inventors: Randy L. Yach, Phoenix; Richard L. Hull, Chandler, both of Ariz.

[73] Assignee: Microchip Technology Incorporated, Chandler, Ariz.

[21] Appl. No.: 508,332

[22] Filed: Jul. 27, 1995

[51] Int. Cl.$^6$ .................................................. H02H 3/20
[52] U.S. Cl. ............................. 361/90; 361/115; 361/92
[58] Field of Search .............................. 361/93, 92, 91, 361/90, 115

[56] References Cited

U.S. PATENT DOCUMENTS 5,243,233  9/1993  Cliff ..................................... 307/296.4

Primary Examiner—Jeffrey A. Gaffin
Assistant Examiner—Stephen W. Jackson
Attorney, Agent, or Firm—Wigman, Cohen, Leitner & Myers, P.C.

[57] ABSTRACT

A power-on reset circuit (10) for resetting electronic circuitry to be monitored has been provided. The power-on reset circuit includes a trip point generator (12) including the worst case component (the component that requires the greatest power supply voltage to operate) within the electronic circuitry for setting the threshold voltage for taking the electronic circuitry out of reset such that if the worst case component is operative, it is guaranteed that all components are operative and, thus, the electronic circuitry can be taken out of reset. Moreover, because the threshold voltage is based upon the worst case component of the electronic circuitry, the threshold voltage of the trip point generator will adequately track the electronic circuitry over normal process and temperature variations. Additionally, the power-on reset circuit includes a noise filter (34) for placing the electronic circuitry back into reset if variations within the power supply voltage causes the power supply voltage level to fall below a predetermined threshold for at least a minimum period of time.

6 Claims, 2 Drawing Sheets

POWER-ON RESET CIRCUIT

BACKGROUND OF THE INVENTION

This invention relates to power-on reset circuits for holding electronic circuitry in reset when the supply voltage applied to the electronic circuitry is below a threshold voltage level and, in particular, to power-on reset circuits whose threshold voltage level is a function of the worst case device/component on the electronic circuitry.

Some form of power supply is required for every electronic circuit. Moreover, each electronic circuit requires some predetermined operating voltage range in order to operate properly. For example, an electronic circuit that requires a power supply of 5 volts may allow a voltage operating range of 4.5 volts to 5.5 volts for proper operation. However, if the power supply voltage falls below the 4.5 volts, the electronic circuit is not guaranteed to function properly, and if the power supply voltage rises above 5.5 volts, the electronic circuit may suffer irreversible damage.

Additionally, in complex electronic circuits such as microprocessors, microcontrollers or other control systems, a reset signal typically exists for holding the electronic circuit in a reset state until the power supply voltage exceeds a predetermined threshold voltage. Additionally, if the power supply voltage falls below the threshold voltage, the electronic circuit should be placed back into the reset state. Failure to reset the electronic circuit when the power supply voltage is below the threshold voltage may result in the electronic circuit functioning inadequately thereby causing catastrophic results. For example, where a microcontroller is used in an anti-lock brake system, inadequate operation of the microcontroller due to a low power supply voltage could cause failure of the braking system. Accordingly, it is of utmost importance to take the electronic circuit out of reset and operate only when the power supply voltage exceeds the threshold voltage. Moreover, once taken out of reset, the electronic circuit must again be placed back into the reset state if the power supply voltage later falls below the threshold voltage.

One scheme for resetting an electronic circuit upon start-up or power-on is to use external elements, such as resistors, capacitors and bipolar devices, to detect when the power supply voltage exceeds a predetermined threshold voltage. This scheme has the disadvantage that the predetermined threshold voltage is typically chosen to be an artificially high voltage level to insure that when the electronic circuit is taken out of reset, all of the various sub-circuits and devices in the electronic circuit are well within their proper operating voltage range. However, by requiring such an artificially high voltage threshold, the overall operating voltage range of the electronic circuit is substantially decreased.

Another scheme for holding an electronic circuit in a reset state upon power-on is to use a timer circuit, coupled for receiving the power supply voltage, including a capacitor that charges through a large resistor such that when the capacitor is fully charged, the electronic circuit is taken out of reset. However, this scheme provides only for a fixed time to hold the electronic circuit in reset while the voltage on power supply is ramping up and, thus, does not reliably handle slow power supply ramps. Accordingly, such schemes require a certain rise time specification on the power supply.

Another more advanced scheme for holding an electronic circuit in a reset state upon power-on is to use a circuit that generates power-on reset signals when the power supply exceeds a fixed DC trip point threshold. Such circuits typically include a comparator having one of its inputs coupled to receive a band gap voltage and the other input coupled to receive a scaled version of the power supply voltage, via a resistor divider circuit, such that when the scaled version of the power supply voltage exceeds the band gap voltage, the comparator trips and allows the electronic circuit to be taken out of reset. However, such an implementation requires substantial additional circuitry and the DC trip point threshold is generally chosen to be an artificially high voltage. Moreover, the DC trip point threshold is difficult to pinpoint due to normal manufacturing variances of the circuit components such as the offset errors in the comparator.

It is therefor a principal object of the present invention to provide an improved power-on reset circuit for generating a trip point threshold voltage that is based upon and tracks the worst case device/component (i.e., the component that requires the highest supply voltage to operate properly) on the electronic circuit thereby guaranteeing proper operation of the electronic device when taken out of reset while maximizing the operating voltage range of the electronic circuit.

It is a further object of the present invention to provide a power-on reset circuit that places the electronic circuitry back into a reset state if the power supply voltage later falls below the threshold voltage.

SUMMARY OF THE INVENTION

The present invention provides a power-on reset circuit for resetting electronic circuitry coupled to the power-on reset circuit when a trip point generator representative of the worst case component within the electronic circuitry is detected to be operative. The power-on reset circuit of the present invention includes a trip point generator comprised of the worst case component of the electronic circuitry monitored where the worst case component is the component within the electronic circuitry that requires the highest supply voltage in order to operate properly. By assuring that the worst case component is operating properly, it is assured that all of the components on the electronic circuitry are also operating properly. Additionally, because the trip point generator of the present invention includes the worst case component of the electronic circuitry, the threshold voltage of the trip point generator will adequately track the electronic circuitry over normal process and temperature variations. Therefore, if process or temperature variations cause a change in the required power supply voltage threshold for the worst case component to operate properly, the trip point threshold voltage changes accordingly. Therefore, the present invention provides the best possible voltage range for the electronic circuitry to be monitored with the guarantee that the electronic circuitry will not be taken out of reset before the power supply voltage exceeds a threshold voltage that is within the proper operating voltage range for all devices within the electronic circuitry regardless of process and temperature variation.

The present invention does require one to ascertain the worst case component within the electronic circuitry to be monitored. Once this is obtained, however, it is assured that once the worst case component is operative, all components within the electronic circuitry are operative and the electronic circuitry can be taken out of reset. Sometimes the ascertaining of the worst case device is fairly simple such as in the case where the electronic circuitry to be monitored takes the form of an electronically programmable read-only-memory (EPROM) memory. In this case, the worst case component is chosen to be an EPROM transistor because the transistors used in the EPROM memory cells have a threshold voltage substantially higher than the other transistors used in the process. In other cases, however, it may not be readily apparent which component is worst case. Therefore, two or more components may be used to set the threshold voltage whereby the power supply voltage must be at a sufficient voltage level to enable all the selected components to be operative before allowing the electronic circuitry to be taken out of reset.

The present invention also includes a noise filter for placing the electronic circuitry back into reset if the power supply voltage falls below a predetermined threshold for at least a minimum period of time. In this manner, the present invention places the electronic circuitry back into reset in response to transient variations in the power supply voltage that go outside of the worst case device voltage range and are long enough to cause a device malfunction. However, very short voltage supply fluctuations that will not cause device failure are ignored.

BRIEF DESCRIPTION OF THE DRAWINGS

The above and still further objects, features, aspects and attendant advantages of the present invention will become apparent from consideration of the following detailed description in conjunction with the accompanying drawings, in which.

DETAILED DESCRIPTION OF THE PREFERRED EMBODIMENTS

Figure 1:
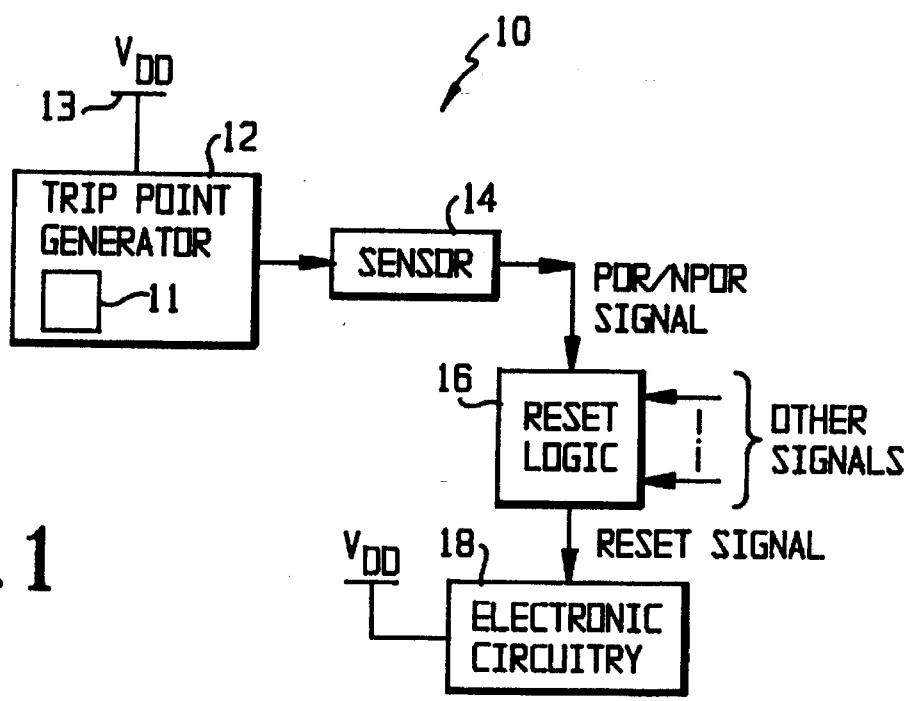
FIG. 1 is a simplified block diagram illustrating a power-on reset circuit in accordance with the present invention.

The present invention provides a power-on reset circuit for resetting electronic circuitry coupled to the power-on reset circuit when a trip point generator representative of the worst case sub-circuit/device/component within the electronic circuitry is detected to be operative. The power-on reset circuit includes a trip point generator comprised of the worst case component of the electronic circuitry monitored where the worst case component is the component within the electronic circuitry that requires the highest supply voltage in order to operate properly. Referring to FIG. 1, a simplified block diagram illustrating power-on reset circuit 10 is shown. The reset circuit includes trip point generator 12 that is coupled to a power supply voltage terminal 13 at which a power supply operating voltage of $V_{DD}$ is applied. Trip point generator 12 includes the worst case device/component/subcircuit (11) of the electronic circuitry (18) to be monitored such that when the worst case device becomes operative, a corresponding logic signal is generated indicative that the worst case component is now operative with the assurance that all devices within the electronic circuitry are also operative. The worst case component 11 may be either an actual isolated component from within the electronic circuitry thereby conserving size and power of the combined power-on reset circuit and the electronic circuitry, or it may be a duplicate/replica of the worst case component.

Sensor 14 senses and detects when the worst case device of trip point generator 12 becomes operative and correspondingly provides a pulse on the power-on reset signal (signal POR) or alternately the complement or inversion thereof (a not power-on reset signal, or signal NPOR) to the electronic circuitry 18, via logic 16, for allowing the electronic circuitry to be taken out of reset since the operating voltage has achieved a predetermined threshold voltage level to allow the worst case device within electronic circuitry 18 to become operative.

The power-on reset signal generated by sensor 14 is typically supplied to reset logic 16, which may be responsive to other signals, such as an external pin, a watch dog timer or an interrupt signal, for holding electronic circuitry 18 in reset whereby reset logic 16 supplies a reset signal to electronic circuitry 18. Generally, whenever signal POR is a logic high (or equivalently signal NPOR is a logic low), it is desired to place electronic circuitry 18 in a reset condition. Therefore, reset logic 16 supplies an active reset signal to electronic circuitry 18 to place circuitry 18 in a reset condition.

Because the trip point generator of the present invention includes the worst case component 11 of electronic circuitry 18, the threshold voltage of the trip point generator adequately tracks electronic circuitry 18 over normal process and temperature variation so as to provide the optimum threshold voltage for allowing electronic circuitry 18 to be taken out of reset and for allowing for the maximum power supply operating range of electronic circuitry 18. Therefore, if process or temperature variations cause a change in the required power supply voltage threshold for worst case component 11 to operate properly, the trip point threshold voltage changes accordingly and electronic circuitry 18 is not taken out of reset until worst case component 11 is operative. Therefore, the present invention provides the best possible voltage range for the electronic circuitry 18 with the guarantee that electronic circuitry 18 will not be taken out of reset before the power supply voltage exceeds a threshold voltage that is within the proper operating voltage range for all devices within electronic circuitry 18 regardless of process and temperature variation.

It should be clear that the power-on reset signal of the present invention is not dependent upon the ramp rate of the power supply and, thus the present invention requires no power supply ramp rate specification for proper operation. Rather, the power-on reset signal is simply a function of when the worst case component becomes operative. Additionally, the present invention does not require the use of timers or the like.

Figure 2:
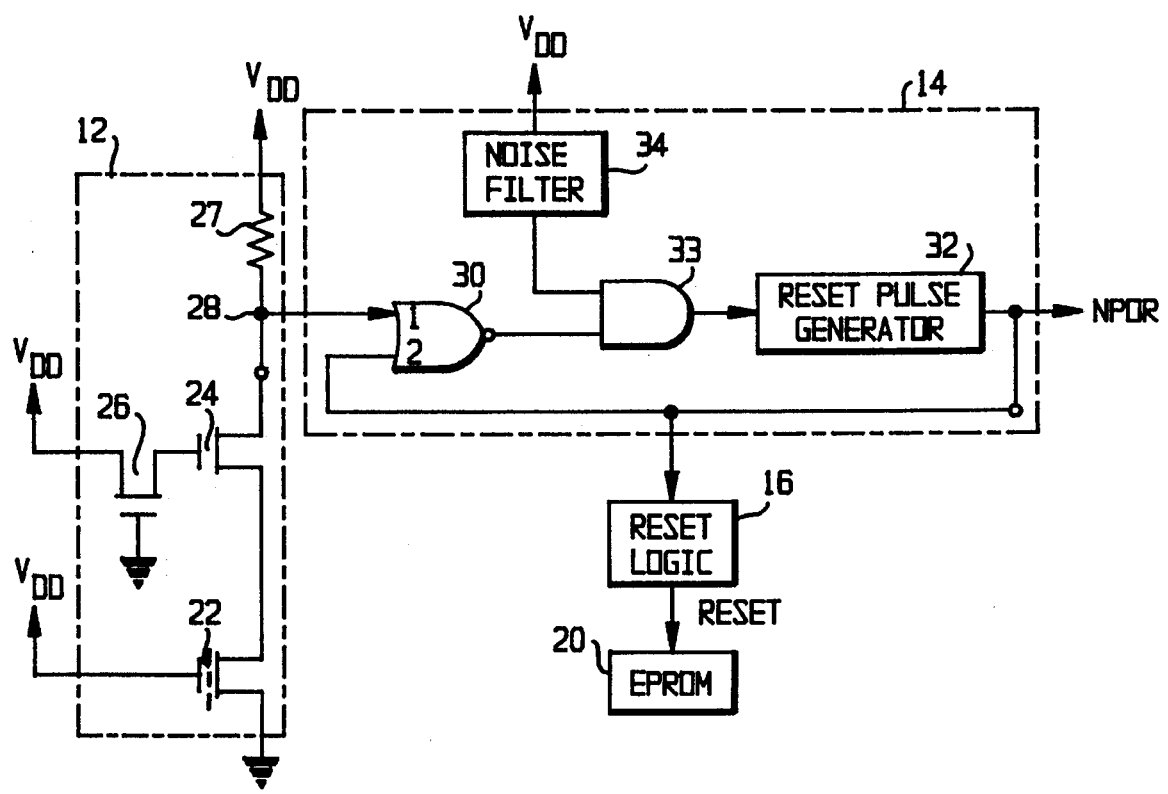
FIG. 2 is a more detailed schematic/block diagram illustrating the power-on reset circuit of FIG. 1 and illustrating the trip point generator as including an EPROM transistor for generating the trip point threshold voltage.

Referring to FIG. 2, a more detailed schematic/block diagram illustrating the power-on reset circuit of FIG. 1 is shown. It is understood that components shown in FIG. 2 that are identical to components shown in FIG. 1 are identified by like reference numbers. The embodiment of FIG. 2 comprises trip point generator 12 including electronically programmable read-only-memory (EPROM) transistor 22 for generating the trip point threshold voltage to be used for resetting EPROM 20. Here, since the electronic circuitry to be monitored is EPROM memory device 20, the worst case device is chosen to be EPROM transistor 22 because the transistors used in the EPROM memory cells have a threshold voltage substantially higher than the other transistors used in the process. Accordingly, when EPROM memory cell transistor 22 becomes operative, it is assured that all transistors and components within EPROM 20 are also operative.

EPROM transistor 22 has a control/gate electrode coupled to receive power supply voltage $V_{DD}$, and a source electrode returned to ground. Trip point generator 12 further includes transistors 24 and 26 as well as resistor 28. Transistor 24 has a source electrode coupled to the drain electrode of transistor 22 and drain electrode coupled to circuit node 28. The gate electrode of transistor 24 is coupled through resistor-configured transistor 26 to receive power supply voltage $V_{DD}$. In particular, transistor 26 has a source electrode coupled to the gate electrode of transistor 24, a gate electrode returned to ground and a drain electrode coupled to receive power supply voltage $V_{DD}$. Additionally, circuit node 28 is coupled through resistor 27 to receive power supply voltage $V_{DD}$.

Sensor 14 senses and detects when EPROM transistor 22 becomes operative and generates a corresponding pulse to allow EPROM 20 to be taken out of reset (assuming that all the other conditions set by reset logic 16 are also satisfied).

Sensor 14 includes NOR gate 30, AND gate 33, reset pulse generator 32 and noise filter 34. NOR gate 30 has a first input coupled to circuit node 28 and a second input coupled to the output of reset generator 32. The output of NOR gate 30 is coupled to a first input of AND gate 33 the output of which is supplied to an input of generator 32. The second input of AND gate 33 is coupled to an output of noise filter 34 the latter having an input coupled to the supply voltage terminal for receiving operating potential $V_{DD}$. The output of reset pulse generator 32 supplies not power-on reset signal (NPOR) to EPROM 20, via logic 16, wherein signal NPOR is a logic low when worst EPROM transistor 22 is non-operative thereby holding EPROM 20 in a reset condition and a logic high when transistor 22 is operative thereby allowing EPROM 20 to be taken out of reset. Although generator 32 provides a not power-on reset (NPOR) signal, it is understood that the inversion thereof, a power-on reset (POR) signal, could also be provided.

In operation and upon voltage power-on, reset pulse generator 32 initially provides a logic low output thereby placing signal NPOR at a logic low ("0") level and holding EPROM 20 in a reset condition. Accordingly, the second input of NOR gate 30 is at a logic "0". Moreover, the voltage at circuit node 28 is substantially equal to voltage $V_{DD}$ to thereby apply a logic "1" to the first input of NOR gate 30. In response, NOR gate 30 applies a logic "0" to the first input of AND gate 33.

Also upon power-on, noise filter 34 is initialized to apply a logic "1" to the second input of NOR gate 33. Accordingly, AND gate 33 applies a logic "0" to the input of reset pulse generator 32 thereby holding the output of reset pulse generator 32 at a logic low and forcing the electronic circuitry to be monitored, in this case, EPROM 20, to remain in a reset condition.

When voltage $V_{DD}$ has risen above the threshold voltage to enable EPROM transistor 22 to become operative, current is allowed to flow through transistor 22 as well as transistor 24 and resistor 27 and the voltage appearing at circuit node 28 decreases to a voltage level indicative of a logic low voltage level. This forces NOR gate 30 to provide a logic "1" at its output which propagates through AND gate 33 to provide a logic "1" at the input of reset pulse generator 32. In response, reset pulse generator 32 causes signal NPOR to be at a logic high voltage level thereby allowing EPROM 20 to be taken out of reset since EPROM transistor 22 is now operative. Moreover, since trip point generator 12 includes the worst case transistor 22 within EPROM 20, it can be assured that when transistor 22 becomes operative, all transistors and components within EPROM 20 are also operative.

Furthermore, if voltage $V_{DD}$ falls below the threshold level to maintain EPROM transistor 22 operative, then transistor 22 will turn off and the voltage appearing at circuit node 28 again becomes a logic high. In response, NOR gate 30 provides a logic "0" at the first input of NOR gate 33 which accordingly provides a logic low at the input of reset pulse generator 32 and causes the output of generator 32 to go low again and place EPROM 20 back into reset.

Mid-frequency variations, such as those variations in the range of 1 megahertz (MHz), may occur on voltage $V_{DD}$ that may not result in a sufficiently low voltage level long enough to cause transistor 22 to turn off but may be long enough to cause failure of EPROM 20. Furthermore, high frequency variations, such as those above 10 MHz, may occur on voltage $V_{DD}$, such as those due to electromagnetic coupling (EMC), that would not cause EPROM 20 to operate improperly and should not cause resetting of EPROM 20. Accordingly, the present invention includes noise filter 34 that monitors the power supply voltage after power-on to determine if the power supply has fallen below the threshold level set by the worst case device for a long enough time to cause damage to EPROM 20, but possibly not long enough to cause transistor 22 to turn off. In this manner, noise filter 34 responds to such mid-frequency noise that may cause failures within EPROM 20 of which may not be long enough to turn off transistor 22, but does not respond to high frequency noise that would not cause improper operation of EPROM 20.

In operation, noise filter 34 includes simple circuitry (not shown) such that if the power supply voltage falls below a predetermined threshold for a predetermined amount of time to allow discharging of a capacitor, then noise filter 34 provides a logic "0" at its output. This provides a logic "0" at the input of reset pulse generator 32 thereby causing generator 32 to assert signal NPOR and reset EPROM 20. Thus, the present invention not only holds EPROM 20 in a reset condition until the power supply voltage has increased to a level such that the worst case component becomes operative, but it also includes noise filter 34 for placing the EPROM back into reset if the power supply voltage falls below a predetermined threshold for at least a minimum period of time.

As mentioned above, the present invention generally requires one to ascertain the worst case component within the electronic circuitry to be monitored. Once this is obtained, however, it is assured that once the worst case component is operative, all components within the electronic circuitry are operative and the circuitry can be taken out of reset. Ascertaining the worst case device of an electronic circuit may be fairly simple such as in the above embodiment where the electronic circuitry to be monitored was an EPROM memory device. In that case, the worst case component was ascertained to be an EPROM transistor because the transistors used in the EPROM memory cells have a threshold voltage substantially higher than the other transistors used in the process.

Figure 3:
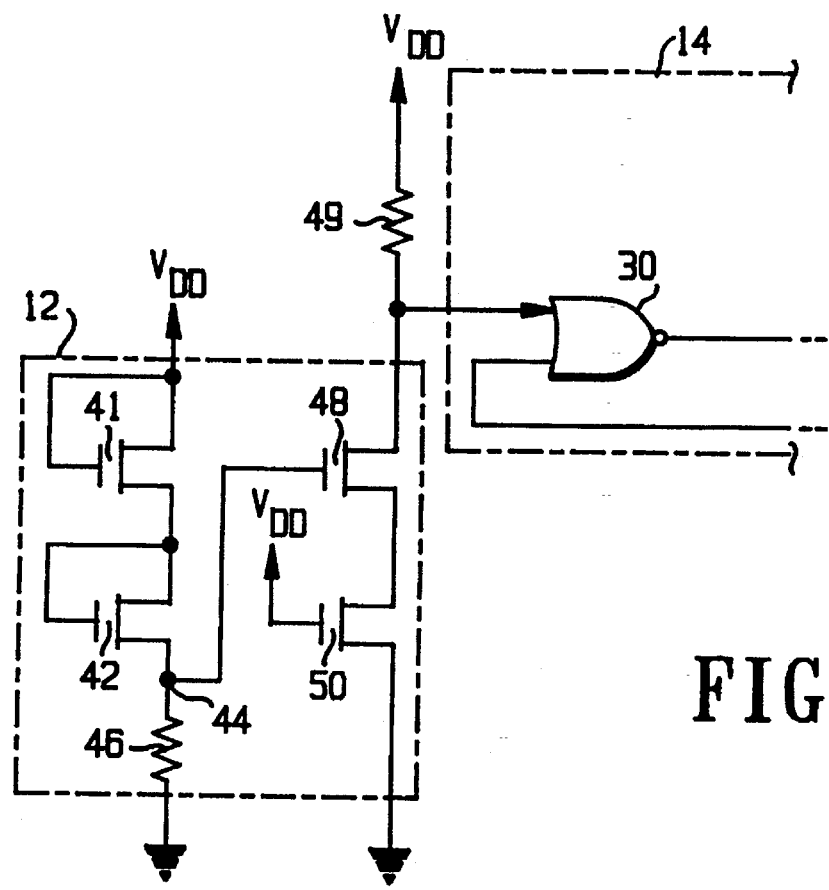
FIG. 3 is an alternate embodiment of the trip point generator including at least two components for generating the trip point threshold voltage.

In some electronic circuits, however, it may not be readily or easily ascertainable which component requires the highest operating supply voltage to function properly. In such instances, two or more components may be used to set the threshold voltage whereby the power supply voltage must reach a sufficient voltage level so as to enable the selected two or more components operative before the electronic circuitry to be monitored is allowed to be taken out of reset. Referring to FIG. 3, an alternate embodiment of trip point generator 12 is shown. It is understood that components shown in FIG. 3 that are identical to components shown in FIGS. 1 and 2 are identified by like reference numbers. Trip point generator 12 of FIG. 3 includes serially-coupled transistors 41 and 42 coupled between a supply voltage terminal for receiving operating potential $V_{DD}$ and circuit node 44. In particular, transistor 41 is configured to operate as a diode whereby its drain and gate electrodes are coupled to receive the power supply voltage potential $V_{DD}$ while its source electrode coupled to the drain and gate electrodes of diode-configured transistor 42. Further, the source electrode of transistor 42 is coupled to circuit node 44 the later of which is returned to ground through resistor 46.

Circuit node 44 is further coupled to the gate electrode of transistor 48 the latter of which has a drain electrode coupled to the first input of NOR gate 30 and through resistor 49 to receive power supply voltage Vhd DD. The source electrode of transistor 48 is coupled to the drain electrode of transistor 50 the latter of which has a source electrode return to ground and a gate electrode coupled for receiving the power supply voltage $V_{DD}$.

In operation, when voltage $V_{DD}$ increases to a sufficient voltage level so as to allow both transistors 41 and 42 to become operative, current flows through transistors 41 and 42 causing the voltage appearing at circuit node 44 to increase to a sufficient level to turn on transistor 48. This causes the voltage appearing at the first input of NOR gate 30 to be pulled down to a logic zero via transistor 50. Thus, similar to the embodiment of FIG. 2, when transistors 41 and 42 are operative, the logic voltage appearing at the first input of NOR gate 30 is a logic low and indicative of the fact that transistors 41 and 42 are operative. In this manner, two or more transistors may be coupled together, such as in a serial fashion as shown in FIG. 3, so that if it is difficult to ascertain the worse case component from within electronic circuitry to be monitored, then two or more components may be used to set the threshold voltage level that determines when the electronic circuitry may be taken out of reset. As illustrated in FIG. 3, both transistors 41 and 42 must become operative before the electronic circuitry is allowed to come out of reset.

By now it should be apparent that a novel power-on reset circuit for resetting electronic circuitry to be monitored has been provided. The power-on reset circuit includes a trip point generator including the worst case component (the component that requires the greatest power supply voltage to operate) within the electronic circuitry for setting the threshold voltage for taking the electronic circuitry out of reset such that if the worst case component is operative, it is guaranteed that all components are operative. Moreover, because the threshold voltage is based upon the worst case component of the electronic circuitry, the threshold voltage of the trip point generator will adequately track the electronic circuitry over normal process and temperature variations. Additionally, the power-on reset circuit includes a noise filter for placing the electronic circuitry back into reset if variations within the power supply voltage causes the power supply voltage level to fall below a predetermined threshold for at least a minimum period of time.

Although certain preferred embodiments and methods have been disclosed herein, it will be apparent to those skilled in the art from consideration of the foregoing description that variations and modifications of the described embodiments and methods may be made without departing from the true spirit and scope of the invention. Accordingly, it is intended that the invention shall be limited only to the extent required by the appended claims and the rules and principles of applicable law.

What is claimed is:

1. A power-on reset circuit coupled to an electronic circuit for placing the electronic circuit in reset when power is turned on and until the supply voltage for the electronic circuit reaches a predetermined threshold level and for taking the electronic circuit out of reset when the supply voltage exceeds said threshold level, the power-on reset circuit comprising:

a trip point generator coupled to receive the supply voltage and incorporating a worst case component constituting a component of the electronic circuit that requires the highest supply voltage to operate properly such that when said worst case component becomes operative, all components of the electronic are also in proper operation; and sensor means coupled to said trip point generator and responsive to said worst case component becoming operative for generating a corresponding signal to take the electronic circuit out of reset, said sensor means including noise filter means for returning the electronic circuit to reset when supply voltage variations cause the supply voltage to drop below the threshold level for at least a predetermined time interval.

2. The power-on reset circuit of claim 1, wherein said worst case component is an electronically programmable read-only-memory (EPROM) transistor and the electronic circuit is an EPROM.

3. The power-on reset circuit of claim 1, wherein said worst case component includes at least two components of the electronic circuit which must be rendered operative before the electronic circuit can be taken out of reset.

4. The power-on reset circuit of claim 1, wherein said sensor means includes a reset pulse generator for generating a power-on reset signal to take the electronic circuit out of reset when said worst case component becomes operative.

5. A method for taking an electronic circuit out of a reset state assumed by the electronic circuit when a power supply voltage thereto is turned on and until the supply voltage exceeds a threshold level, the method comprising the steps of:

establishing a threshold voltage at which the electronic circuit is taken out of the reset state based upon a worst case component, constituting a component of the electronic circuit that requires the highest supply voltage for proper operation, becomes operative;

sensing when said worst case component becomes operative;

taking the electronic circuit out of the reset state in response to said worst case component becoming operative; and returning the electronic circuit to the reset state when variations in the supply voltage cause the magnitude thereof to fall below said threshold level for a predetermined interval of time.

6. A power-on reset circuit coupled to a memory device for allowing the memory device to be taken out of reset when a power supply voltage applied to the memory device exceeds a threshold voltage, the power-on reset circuit comprising:

a trip point generator circuit coupled for receiving the power supply voltage and including a memory cell transistor associated with the memory device for generating a signal when said memory cell transistor becomes operative, said memory cell transistor requiring the highest supply voltage among the components of the memory device for proper operation, such that when said memory cell transistor becomes operative, all components of the memory device are also operative;

sensor means coupled to said trip point generator for detecting when said memory cell transistor becomes operative and for thereupon generating a corresponding signal to take the memory device out of reset; said sensor means including a noise filter for returning the memory device to reset when variations in the supply voltage level cause the power supply voltage level to drop below said threshold voltage for at least a predetermined period of time.

* * * * *